United States Patent
Bell

(10) Patent No.: US 7,310,233 B2
(45) Date of Patent: Dec. 18, 2007

(54) APPARATUS AND METHOD FOR TRANSFERRING HEAT FROM AN ELECTRICAL MODULE

(75) Inventor: Michael Ray Bell, Dallas, TX (US)

(73) Assignee: Tyco Electronics Power Systems, Mesquite, TX (US)

( * ) Notice: Subject to any disclaimer, the term of this patent is extended or adjusted under 35 U.S.C. 154(b) by 363 days.

(21) Appl. No.: 11/045,911

(22) Filed: Jan. 28, 2005

(65) Prior Publication Data

US 2006/0171121 A1    Aug. 3, 2006

(51) Int. Cl.
*H05K 7/20* (2006.01)

(52) U.S. Cl. ............ 361/704; 165/80.3; 165/185; 361/707; 361/703; 361/715; 361/719

(58) Field of Classification Search ......... 361/704, 361/712–713
See application file for complete search history.

(56) References Cited

U.S. PATENT DOCUMENTS

| | | | | |
|---|---|---|---|---|
| 4,612,601 A | * | 9/1986 | Watari | 361/705 |
| 4,768,286 A | * | 9/1988 | Ketcham | 29/841 |
| 5,054,193 A | * | 10/1991 | Ohms et al. | 29/840 |
| 5,325,265 A | * | 6/1994 | Turlik et al. | 361/702 |
| 5,373,418 A | * | 12/1994 | Hayasi | 361/707 |
| 5,812,372 A | * | 9/1998 | Galyon et al. | 361/699 |
| 6,035,524 A | * | 3/2000 | Suppa et al. | 29/832 |
| 6,175,500 B1 | | 1/2001 | Roy | |
| 6,343,017 B1 | * | 1/2002 | Yu et al. | 361/704 |
| 6,966,361 B2 | * | 11/2005 | Connors | 165/104.33 |
| 6,982,877 B2 | * | 1/2006 | Vinson et al. | 361/719 |
| 6,992,893 B2 | * | 1/2006 | Miyamura et al. | 361/705 |

* cited by examiner

*Primary Examiner*—Gregory D Thompson
(74) *Attorney, Agent, or Firm*—Law Office of Donald D. Mondul

(57) ABSTRACT

An apparatus for transferring heat from an electrical module includes: (a) a thermally conductive base member having a plurality of edges establishing a polygonal perimeter and having a first side for presentation toward the electrical module; and (b) a heat transferring structure integrally formed with the base member and extending from a second side of the base member opposite from the first side. The heat transferring structure occupies less than all of the second side and establishes a margin substantially about the perimeter.

2 Claims, 5 Drawing Sheets

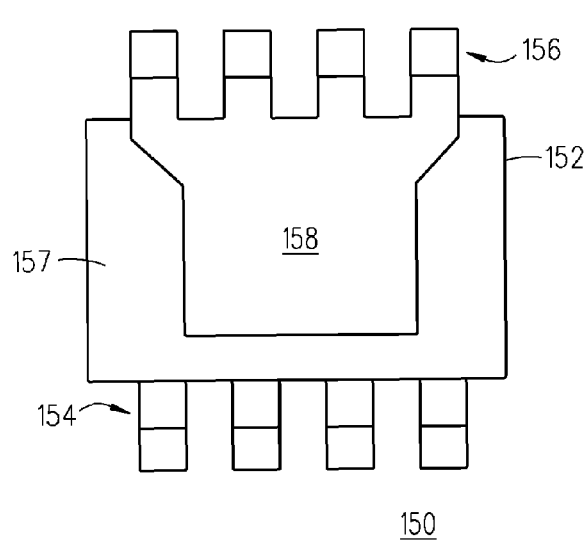
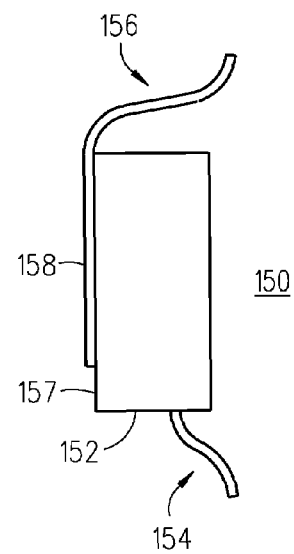
FIG. 6　　　　　FIG. 7
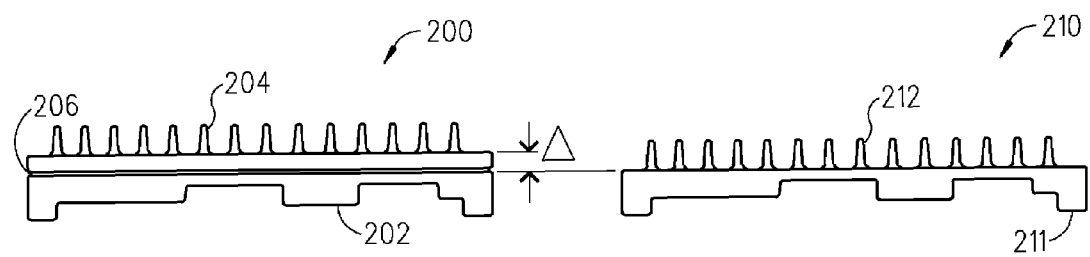
FIG. 8 (PRIOR ART)　　　　　FIG. 9

_US 7,310,233 B2_

APPARATUS AND METHOD FOR TRANSFERRING HEAT FROM AN ELECTRICAL MODULE

BACKGROUND OF THE INVENTION

The present invention is directed to apparatuses and methods for transferring heat from electrical modules, and especially to apparatuses for transferring heat from electrical modules presenting a low profile in their assembled state with an electrical module.

Removal of heat from electrical or electronic circuitry is an important design consideration that improves operational performance of the circuitry and lengthens service live of products employing the circuitry. Many circuits in today's products are embodied at least in part in electrical or electronic modules containing a plurality of components. The terms electrical and electronic are used interchangeably here with no important distinction between them. It often occurs that particular individual components within an electrical module generate most of the waste heat. Heat transferring devices (also sometimes referred to as heat sinks, or heat sinking devices, or heat spreading devices or heat dissipating devices) are known to be placed in proximity with the heat generating components to transfer heat from those components and, hence, from the module.

Most efficient heat transferring materials are also electrically conductive. There is therefore often a need to ensure that an electrically insulating barrier is interposed between an electrical module and its associated heat transferring structure. Such electrical insulation is detrimental to heat transmission from the module if the insulation is too thick. Many materials have been tried in such designs, and electrostatically deposited electrically insulating material is one solution that has been employed. Such electrostatic deposition of electrically insulating material between an electrical module and its associated heat transferring apparatus is employed to advantage in the preferred embodiment of the present invention.

However, substantially any interface contributes to inefficiency in heat transfer. Thus, an intervening electrically insulating layer between an electrical module and an associated heat transferring apparatus affects efficiency of heat transfer from the module to the heat transferring apparatus. Further, a common structure for effecting heat transfer is to provide a heat transmitting base member adjacent to an electrical module, and install a heat transferring structure, such as a finned structure, upon the base member. The interface between the base member and the installed heat transferring structure presents another interface that reduces efficiency of heat transfer away from the module.

There is pressure in today's market toward designing products having a small physical size. A compact design achieving small physical size can contribute to greater need for heat transferring apparatuses because there is less room for heat-removing air flow over heat producing components.

There is a need for an efficient heat removing apparatus or heat transferring apparatus that offers a reduced size to contribute to a smaller-sized finished product.

SUMMARY OF THE INVENTION

An apparatus for transferring heat from an electrical module includes: (a) a thermally conductive base member having a plurality of edges establishing a polygonal perimeter and having a first side for presentation toward the electrical module; and (b) a heat transferring structure integrally formed with the base member and extending from a second side of the base member opposite from the first side. The heat transferring structure occupies less than all of the second side and establishes a margin substantially about the perimeter.

It is, therefore, an object of the present invention to provide an efficient heat removing apparatus or heat transferring apparatus that offers a reduced size to contribute to a smaller-sized finished product.

Further objects and features of the present invention will be apparent from the following specification and claims when considered in connection with the accompanying drawings, in which like elements are labeled using like reference numerals in the various figures, illustrating the preferred embodiments of the invention.

BRIEF DESCRIPTION OF THE DRAWINGS

FIG. 6 is a top plan view of an electronic component having an individual heat transferring structure.

FIG. 7 is a side plan view of the electronic component having an individual heat transferring structure illustrated in FIG. 6.

FIG. 8 is a side view of a prior art two-piece heat transferring structure.

FIG. 9 illustrates a side view of the one-piece integrally configured heat transferring structure of the present invention arranged for comparison with FIG. 2.

DETAILED DESCRIPTION OF THE PREFERRED EMBODIMENT

Figure 1:
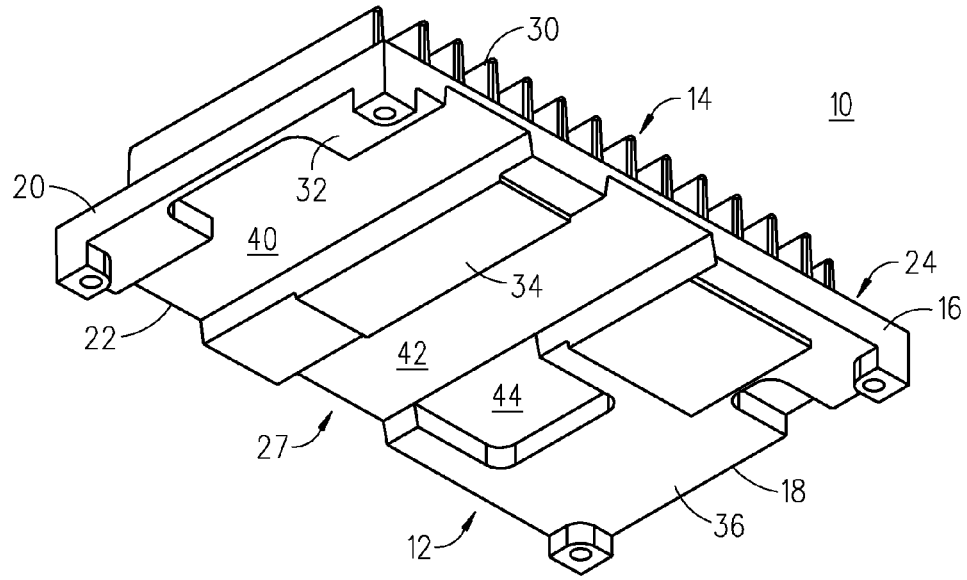
FIG. 1 is a perspective view of a first side of the preferred embodiment of the apparatus of the present invention.
Figure 2:
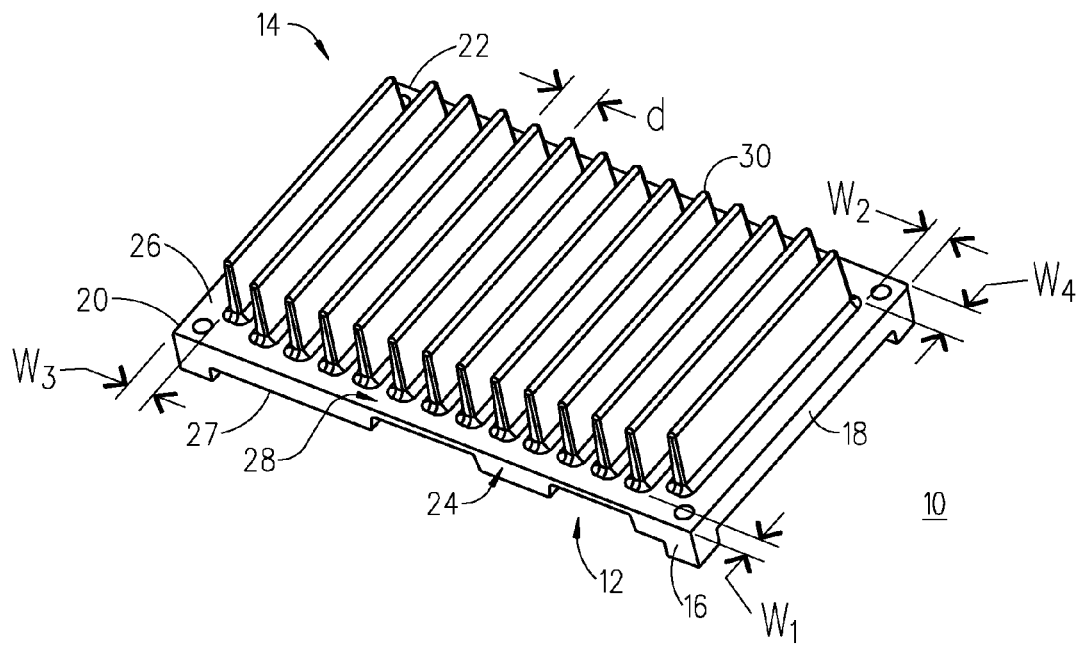
FIG. 2 is a perspective view of a second side of the preferred embodiment of the apparatus of the present invention.

FIG. 1 is a perspective view of a first side of the preferred embodiment of the apparatus of the present invention. FIG. 2 is a perspective view of a second side of the preferred embodiment of the apparatus of the present invention. In FIGS. 1 and 2, a heat transferring apparatus 10 has a thermally conductive base member 12 and a heat transferring structure 14. Heat transferring structure 14 is integrally formed with base member 12. Base member 12 has edges 16, 18, 20, 22 defining a polygonal perimeter 24 of base member 12. Heat transferring structure 14 may be embodied in any structure that enhances transfer of heat from base member 12. In its preferred embodiment illustrated in FIGS. 1 and 2, heat transferring structure 14 is embodied in a plurality of longitudinal substantially parallel fin structures 30 extending from a side or face 26 and separated by a distance d.

Heat transferring structure 14 extends from one side 26 of base member 12 and occupies less than all of side 26. Heat transferring structure 14 establishes a margin 28 (FIG. 2)

substantially about perimeter 24. Preferably margin 28 is established completely about perimeter 24 and defines a width $W_1$ between heat structure 14 and edge 16, defines a width $W_2$ between heat structure 14 and edge 18, defines a width $W_3$ between heat structure 14 and edge 20 and defines a width $W_4$ between heat structure 14 and edge 22. It is preferred that widths $W_1$, $W_2$, $W_3$, $W_4$ are equal.

In its preferred embodiment, heat transferring apparatus 10 is contoured at a side or face 27 to establish low areas 32, 34, 36 and high areas 40, 42, 44 to accommodate electrical component parts in an electrical module (not shown in FIGS. 1 and 2) when heat transferring structure 10 is installed with the electrical module (described hereinafter in connection with FIGS. 4 and 5).

Figure 3:
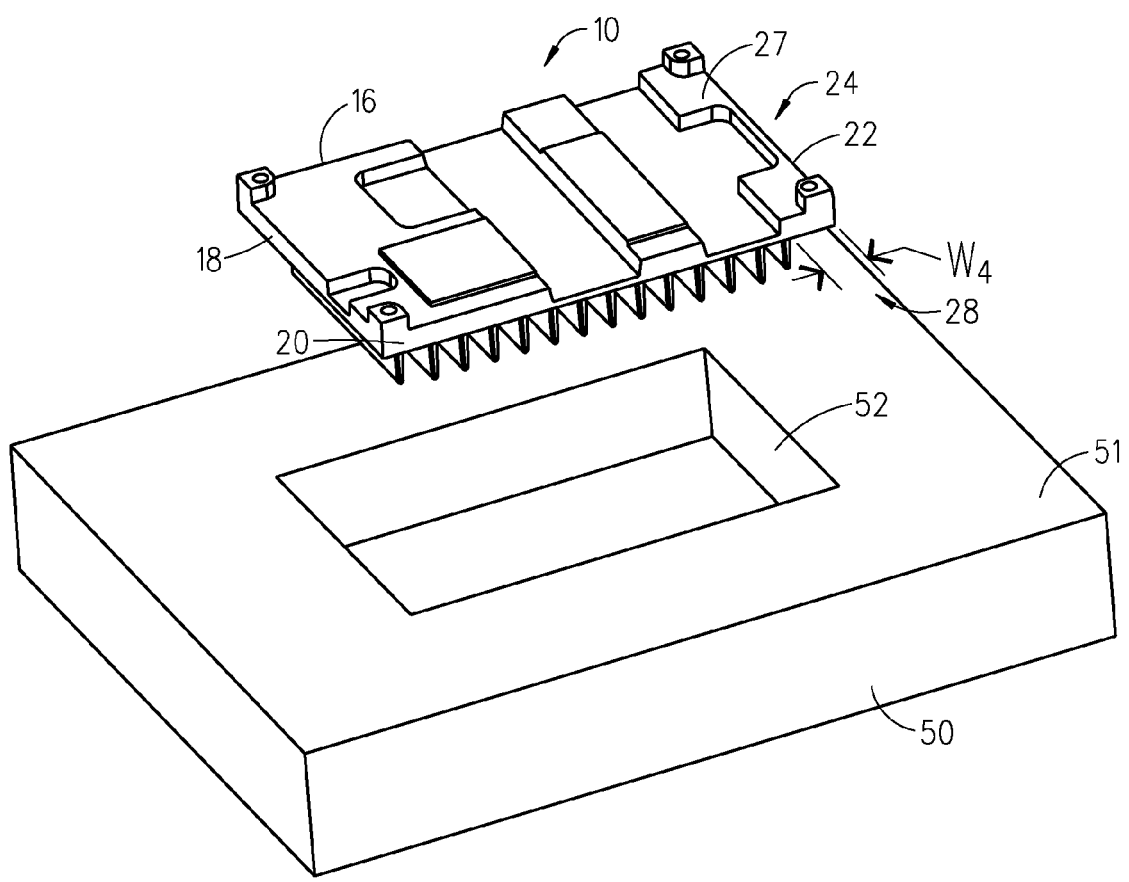
FIG. 3 is a perspective view of the apparatus of the present invention poised for placing in a fixture for use in treating the apparatus.

FIG. 3 is a perspective view of the apparatus of the present invention poised for placing in a fixture for use in treating the apparatus. In FIG. 3, a heat transferring apparatus 10 is suspended over a fixture 50. Fixture 50 presents a top face 51 and an aperture 52. Fixture 50 is configured for receiving apparatus 10 within aperture 52 for a process to apply an electrostatic insulating layer on upward facing side 27. When apparatus 10 is positioned with respect to fixture 50 for a spraying operation, heat transferring structure 14 is inserted within aperture 52 so that margin 28 engages top face 51 entirely around perimeter 24. In such an orientation, when a spraying application of an electrostatic insulating material (not shown in FIG. 3) is carried out toward top side 51 of fixture 50, sprayed material is deposited only on side 27 of apparatus 10. The remainder of apparatus 10 is shielded from deposition of material by fixture 50. Deposition of material may be effected by any of several methods such as, by way of example and not by way of limitation, spraying or immersion. By shielding heat transferring structure 14 from deposited material, heat transfer characteristics of heat transferring structure 14 are not impaired. In actual use, there may be more than one aperture 52 in an aperture 50 in order to realize economies of scale for manufacturing apparatus 10. FIG. 4 is an exploded perspective view of the preferred embodiment of the apparatus of the present invention and an electrical module. FIG. 5 illustrates-the preferred embodiment of the apparatus of the present invention assembled with an electrical module. In FIG. 4, a heat transferring apparatus 60 and an electrical or electronic module 100 are aligned for assembly. In FIG. 5, heat transferring apparatus 60 and electrical or electronic module 100 are assembled. Heat transferring apparatus 60 has a thermally conductive base member 62 and a heat transferring structure 64. Heat transferring structure 64 is integrally formed with base member 62. Base member 62 has edges 66, 68, 70, 72 defining a polygonal perimeter 74 of base member 62. Heat transferring structure 64 may be embodied in any structure that enhances transfer of heat from base member 62. In its preferred embodiment illustrated in FIGS. 4 and 5, heat transferring structure 64 is embodied in a plurality of longitudinal substantially parallel fin structures 80 extending from a side or face 76 and separated by a distance d.

Heat transferring structure 64 extends from one side 76 of base member 62 and occupies less than all of side 76. Heat transferring structure 64 establishes a margin 78 substantially about perimeter 74. Preferably margin 78 is established completely about perimeter 74 and defines a width $W_1$ between heat structure 64 and edge 66, defines a width $W_2$ between heat structure 64 and edge 68, defines a width $W_3$ between heat structure 64 and edge 70 and defines a width $W_4$ between heat structure 64 and edge 72. It is preferred that widths $W_1$, $W_2$, $W_3$, $W_4$ are equal.

Figures 4, 5:
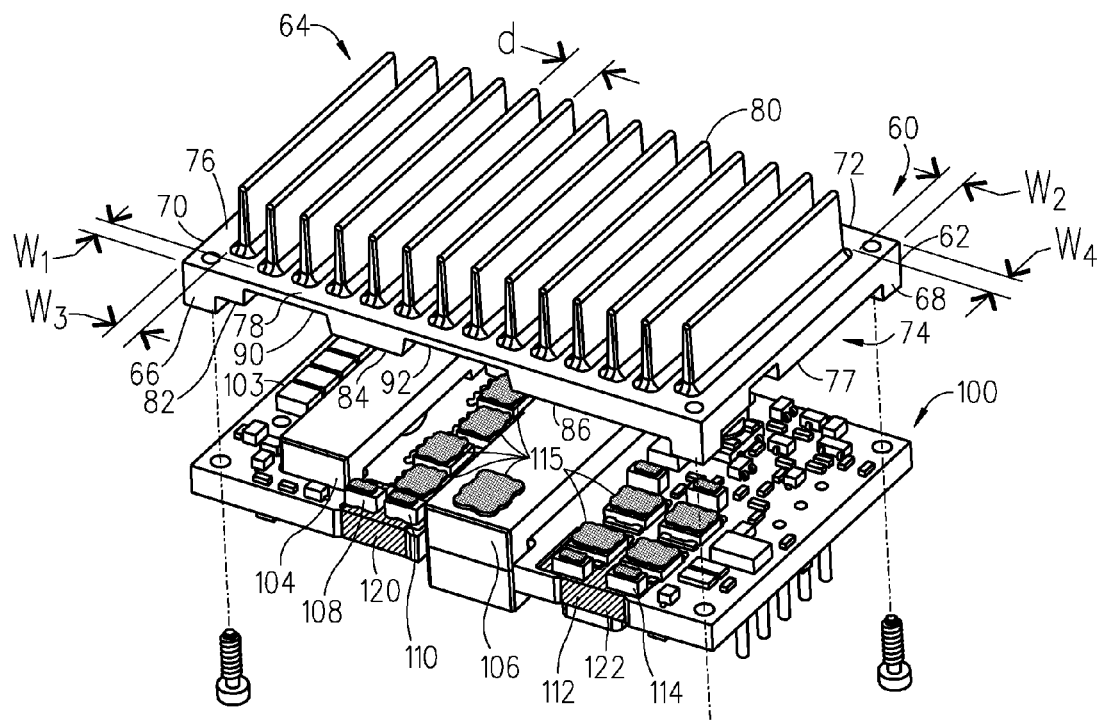
FIG. 4 is an exploded perspective view of the preferred embodiment of the apparatus of the present invention and an electrical module.
FIG. 5 illustrates the preferred embodiment of the apparatus of the present invention assembled with an electrical module.

In its preferred embodiment, heat transferring apparatus 60 is contoured at side 77 to establish low areas 82, 84, 86 and high areas 90, 92 to accommodate electrical component parts in electrical module 100 when heat transferring apparatus 60 is installed with the electrical module 100 (FIG. 5).

Electrical module 100 includes a substrate 102 with electrical components affixed to substrate 102. In order to avoid cluttering FIGS. 4 and 5, not all electrical components will be identified with a reference numeral. Instead, selected representative electrical components will be identified sufficient to explain the structure and operation of the present invention. In all of FIGS. 1-5, like elements are identified by like reference numerals.

Some components 103, 104, 106 are relatively tall components and extend further from substrate 102 than other components, such as components 108, 110, 112, 114. Low areas 82, 84, 86 extend from base member 62 a greater distance than high areas 90, 92 extend from base member 62. Different extensions from base member 62 establish different clearances with substrate 102 when heat transferring apparatus 60 and electrical module 100 are assembled (FIG. 5). By such construction, low area 82 establishes a small clearance with respect to component 103 than would be present if base member 62 were not contoured to establish low area 82. Low area 84 establishes a small clearance with respect to components 108, 110 than would be present if base member 62 were not contoured to establish low area 84. Low area 86 establishes a small clearance with respect to components 112, 114 than would be present if base member 62 were not contoured to establish low area 86. Contouring base member 62 permits establishing high area 90 to accommodate tall component 104, and permits establishing high area 92 to accommodate tall component 106. Such height accommodation of various components 103, 104, 106, 108, 110, 112, 114 establishes a small air gap between heat producing components in electrical module 100 to reduce inefficiency in heat transfer from heat producing components to heat transferring apparatus 60.

Some components may be especially active in heat production so that a thermal conducting material 115 may be introduced to enhance thermal conduction over thermal conduction that can occur through air. Thermal conducting material 115 is not electrically conductive so that no electrical contact is made between electrical module 100 and heat transferring apparatus 60 through an individual component of electrical module 100. Further assurance that no inadvertent or otherwise unwanted electrically conductive contact is made between components of electrical module 100 and heat transferring apparatus 60 is provided by an electrically insulating layer 116. Electrically insulating layer 116 is preferably embodied in an insulating layer that is electrostatically applied to side 77 and edges 66, 68, 70, 72 of heat transferring apparatus 60 using a spray depositing process.

Substrate 102 may be a multi-layered substrate of the sort known in the art having a plurality of circuit bearing layers formed into a single base member for electrical module 100. In such multi-layer substrate structures there may be thermally conductive paths established on inside layers for heat transfer from inner layers (details not illustrated in FIGS. 4 and 5). Such inter-layer heat transfer thermally conductive paths may be terminated at edge connecting loci 120, 122. In such a configuration, one or more of components 108, 110, 112, 114 may be embodied in a thermally conductive block, such as a copper block, connected with one or more of edge connecting loci 120, 122 and thermally coupled with heat transferring apparatus 60 via thermal conducting material 115 to establish a thermal path for heat transfer of inner layers of substrate 102. In another alternate embodiment, one or more components 108, 110, 112, 114 may be included as integrally formed with base member 62.

FIG. 6 is a top plan view of an electronic component having an individual heat transferring structure. FIG. 7 is a side plan view of the electronic component having an individual heat transferring structure illustrated in FIG. 6.

Certain components of electrical module 100 may be embodied as components having individual heat transferring structures or components. Employment of such individually heat transferring configured components, especially with small clearance between the heat transferring structure of the individual component and heat transferring apparatus 60, can establish efficient heat transfer from the individual component. Such heat transfer away from the component can be further enhanced by using a thermal conducting material 115 between the heat transferring structure of the individual component and heat transferring apparatus 60.

In FIGS. 6 and 7, an electrical or electronic component 150 includes a package 152 that contains individual parts and circuitry (not shown in FIGS. 6 and 7). Component 150 also includes a first set of connection structures 154 depending from package 152 and connected with internally located individual parts and circuitry within package 152. A heat transferring structure 158 is located on one face 157 of package 152. Heat transferring structure 158 may be coupled with internal circuitry within package 152, such as, by way of example and not by way of limitation, coupled with at least one ground locus (not shown in FIGS. 6 and 7) within package 152. A second set of connection loci 156 depends from heat transferring structure 158. Connection loci 154, 156 may be employed for electrically coupling component 150 within an electrical or electronic module (e.g., electrical module 100; FIGS. 4 and 5).

FIG. 8 is a side view of a prior art two-piece heat transferring structure. In FIG. 8, a prior art two-piece heat transferring structure 200 includes a heat transmitting base member 202 and a heat transferring structure 204 substantially in register with base member 202. A thermally conductive layer 206 may be inserted between base member 202 and heat transferring structure 204, if desired.

FIG. 9 illustrates a side view of the one-piece integrally configured heat transferring structure of the present invention arranged for comparison with FIG. 2. In FIG. 9, a one-piece integrally configured heat transferring structure 210 configured according to the teachings of the present invention includes a heat conducting base member 211 and an integral heat transferring structure 212. The difference Δ in height occupied by two-piece heat transferring structure 200 and one-piece heat transferring structure 212 is significant, and remains significant even when no thermally conductive layer 206 is used for two-piece heat transferring structure 200. Further, by eliminating any interface between base member 211 and heat transferring structure 212 using an integral construction, one-piece heat transferring structure 210 transmits heat more efficiently than two-piece heat transferring structure 200.

Figure 10:
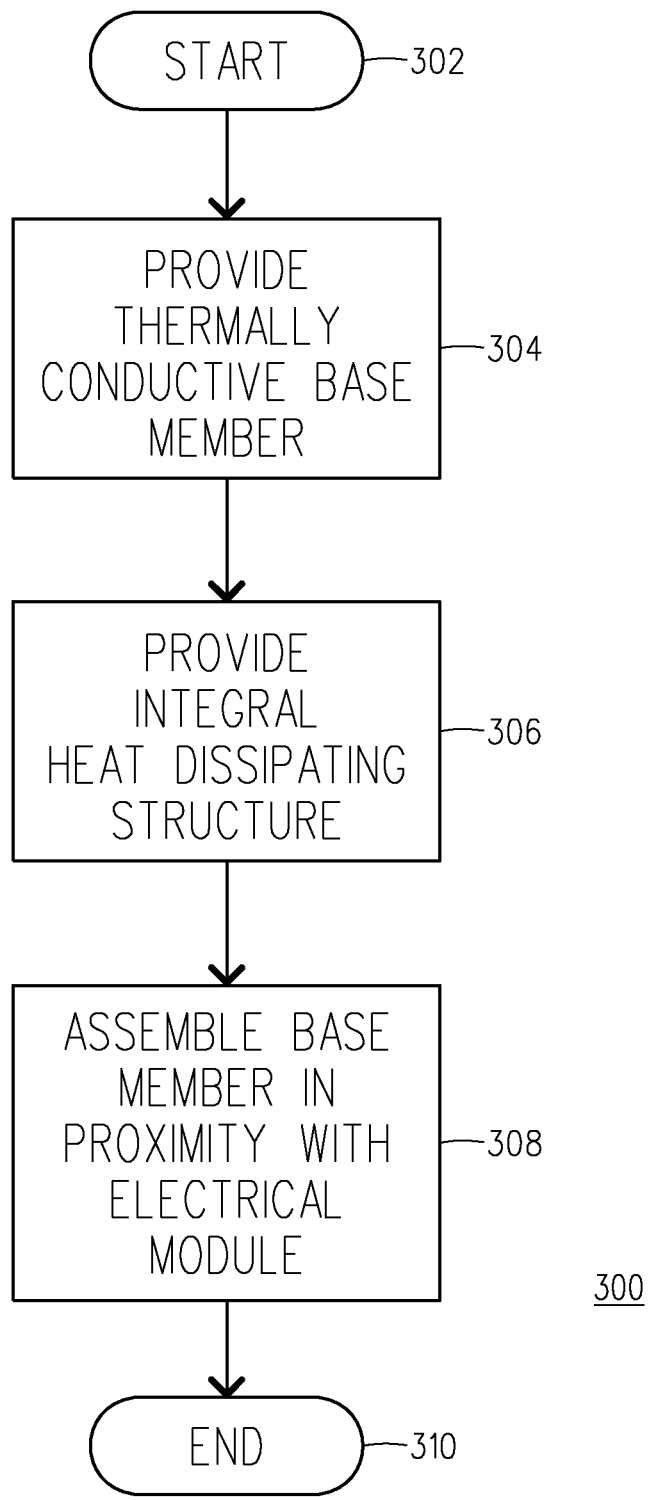
FIG. 10 is a flow chart illustrating the method of the present invention.

FIG. 10 is a flow chart illustrating the method of the present invention. In FIG. 10, a method 300 for transferring heat from an electrical module begins at a START locus 302. Method 300 continues with the step of providing a thermally conductive base member, as indicted by a block 304. The base member has a plurality of edges establishing a polygonal perimeter and has a first side for presentation toward the electrical module.

Method 300 continues with the step of providing a heat transferring structure integrally formed with the base member, as indicted by a block 306. The heat transferring structure extends from a second side of the base member opposite from the first side. The heat transferring structure occupies less than all of the second side and establishes a margin substantially about the perimeter.

Method 300 continues with the step of assembling the base member in proximity with the electrical module, as indicted by a block 308. Method 300 terminates at an END locus 310.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. An apparatus for transferring heat from an electrical module; the apparatus comprising:
   (a) a thermally conductive base member; said base member having a plurality of edges establishing a polygonal perimeter and having a first side for presentation toward said electrical module;
   (b) a heat transferring structure integrally formed with said base member; said heat transferring structure extending from a second side of said base member opposite from said first side; said heat transferring structure occupying less than all of said second side and establishing a margin substantially about said perimeter; and
   (c) an insulative layer affixed with said first side; said insulative layer substantially covering said first sides;
   said electrical module including a plurality of component parts affixed to a first face of a substrate; selected component parts of said plurality of component parts extending further from said first face than other component parts of said plurality of component parts than said selected component parts; said first side of said base member being contoured to accommodate at least one of said selected component parts; said contour reducing average distance between said plurality of component parts and said first side when the apparatus is affixed with said module than would occur if said first side were not contoured; at least one component part of said plurality of component parts comprising an individual heat transferring component; said individual heat transferring component being oriented facing the apparatus when the apparatus is affixed with said module; said substrate including a plurality of substrate layers; at least two substrate layers of said plurality of substrate layers having a thermal path leading to an edge locus for transferring inter-layer heat; said individual heat transferring component being thermally coupled with said edge locus.

2. A heat sink apparatus for use with an electrical device having a plurality of component parts affixed to a first face of a generally planar substrate;
   selected component parts of said plurality of component parts extending further from said first face than other component parts of said plurality of component parts than said selected component parts; the apparatus comprising: a thermally conductive base member having a plurality of edges establishing a polygonal perimeter; said base member having a first side for presentation toward said electrical device when said base member is assembled with said electrical device; said base member having a second side with an integrally formed heat transferring structure extending an extension distance away from said first side; said first side of said base member being contoured to accommodate at least one of said selected component parts; said contour reducing average distance between said plurality of component parts and said first side when the apparatus is affixed with said module to less than would occur if said first side were not contoured; said heat transferring structure establishing a margin substantially about said perimeter; said extension distance being less in said margin than in a region substantially adjacent to said margin; and an insulative layer affixed with said first side; said insulative layer substantially covering said first side; said substrate including a plurality of substrate layers; at least two substrate layers of said plurality of substrate layers having a thermal path leading to an edge locus for transferring inter-layer heat; at least one component part of said plurality of component parts being thermally coupled with said edge locus.

* * * * *